United States Patent
Sawabe et al.

(10) Patent No.: US 7,611,818 B2
(45) Date of Patent: Nov. 3, 2009

(54) PHOTOSENSITIVE RESIN COMPOSITION, PHOTOSENSITIVE ELEMENT, RESIST PATTERN FORMING METHOD AND PROCESS FOR MANUFACTURING PRINTED CIRCUIT BOARD

(75) Inventors: Ken Sawabe, Hitachi (JP); Hanako Yori, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 10/595,920

(22) PCT Filed: Nov. 2, 2004

(86) PCT No.: PCT/JP2004/016255
§ 371 (c)(1),
(2), (4) Date: May 19, 2006

(87) PCT Pub. No.: WO2005/050318
PCT Pub. Date: Jun. 2, 2005

(65) Prior Publication Data
US 2007/0077514 A1    Apr. 5, 2007

(30) Foreign Application Priority Data
Nov. 19, 2003    (JP)    ............... 2003-389836

(51) Int. Cl.
G03F 7/00    (2006.01)
G03F 7/004    (2006.01)
(52) U.S. Cl. ................ 430/270.1; 430/281.1; 430/905; 430/913; 430/311; 430/315; 523/415
(58) Field of Classification Search ............. 430/270.1, 430/281.1, 315; 523/415; 96/90
See application file for complete search history.

(56) References Cited

U.S. PATENT DOCUMENTS 3,479,135 A    11/1969    Pray et al.
(Continued)

FOREIGN PATENT DOCUMENTS

DE    2027467    12/1971
(Continued)

OTHER PUBLICATIONS

International Search Report issued in corresponding application No. PCT/JP2004/016255 completed Jan. 21, 2005 and mailed Feb. 8, 2005.

Primary Examiner—Amanda C. Walke
(74) Attorney, Agent, or Firm—Griffin & Szipl, P.C.

(57) ABSTRACT

A photosensitive resin composition comprising (A) a binder polymer, (B) a photopolymerizing compound with an ethylenic unsaturated bond, (C) a photopolymerization initiator and (D) a compound represented by the following general formula (1) or (2).

[Chemical Formula 1]

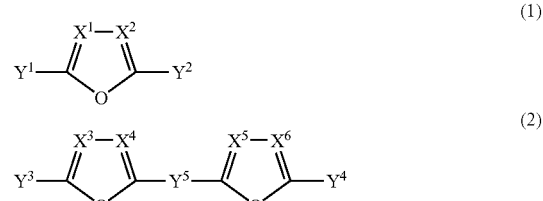

[wherein $X^1$, $X^2$, $X^3$, $X^4$, $X^5$ and $X^6$ each independently represent a CH group, $CCH_3$ group, $CC_2H_5$ group or nitrogen, $Y^1$, $Y^2$, $Y^3$ and $Y^4$ each independently represent optionally substituted aryl, and $Y^5$ represents optionally substituted arylene].

16 Claims, 1 Drawing Sheet

U.S. PATENT DOCUMENTS

| | | | |
|---|---|---|---|
| 3,479,185 A | | 11/1969 | Chambers |
| 3,647,467 A | * | 3/1972 | Grubb .................... 430/270.1 |
| 3,751,259 A | | 8/1973 | Bauer et al. |
| 5,476,690 A | * | 12/1995 | Ohta et al. ................. 430/315 |
| 6,060,215 A | * | 5/2000 | Amanokura et al. ..... 430/281.1 |
| 2003/0186165 A1 | | 10/2003 | Gries et al. |

FOREIGN PATENT DOCUMENTS

| | | |
|---|---|---|
| EP | 0000220 | 1/1979 |
| EP | 0000589 | 2/1979 |
| EP | 0011786 | 6/1980 |
| JP | 60-238830 | 11/1985 |
| JP | 62-180355 | 8/1987 |
| JP | 02-135351 | 5/1990 |
| JP | 05-011439 | 1/1993 |
| JP | 06-069631 | 3/1994 |
| JP | 11-327137 | 11/1999 |
| JP | 2000-214583 | 8/2000 |
| JP | 2003-295426 | 10/2003 |

* cited by examiner

PHOTOSENSITIVE RESIN COMPOSITION, PHOTOSENSITIVE ELEMENT, RESIST PATTERN FORMING METHOD AND PROCESS FOR MANUFACTURING PRINTED CIRCUIT BOARD

This is a National Phase Application in the United States of International Patent Application No. PCT/JP2004/016255 filed Nov. 2, 2004, which claims priority on Japanese Patent Application No. JP 2003-389836, filed Nov. 19, 2003. The entire disclosures of the above patent applications are hereby incorporated by reference.

TECHNICAL FIELD

The present invention relates to a photosensitive resin composition, a photosensitive element, a resist pattern forming method and a process for manufacturing a printed circuit board.

BACKGROUND ART

In the field of printed circuit board manufacturing there are known processes for obtaining printed circuit boards by laminating a photosensitive element onto a copper board, performing pattern exposure against a resist, removing the cured sections with a developing solution, performing etching or plating to form a pattern, and further releasing off the cured sections from the substrate. In such processes, the resist material used for etching, plating and the like is most commonly a photosensitive element comprising a support and a photosensitive resin composition layer, alternatively with a protective film laminated thereon.

With the high densification of printed circuit boards in recent years, demand is increasing for ever higher resolution and adhesion of photosensitive elements. At the same time, photosensitive resin compositions with high sensitivity, low plating bath contamination and low sludge properties are desirable from the standpoint of improved workability.

It has been attempted to improve the properties of photosensitive resin compositions in order to meet such demands. Specifically there have been proposed, for example, photosensitive resin compositions with selective types and amounts of photopolymerization initiators (see German Patent Specification No. 2027467, European Patent Application No. 11786, European Patent Application No. 220, European Patent Application No. 589 and Japanese Patent Application Laid-Open No. 6-69631, for example), photosensitive resin compositions employing the photoinitiator 2,4,5-triphenylimidazole dimer and a hydrogen donor compound in combination (see U.S. Pat. No. 3,479,185, for example), photosensitive resin compositions comprising 2,4,5-triphenylimidazole dimer and a heterocyclic compound (see U.S. Pat. No. 3,647,467, for example), and photosensitive resin compositions with an oxazole compound added thereto (see Japanese Patent Application Laid-Open No. 62-180355, for example).

Problems to be Solved by the Invention

Upon detailed research on conventional photosensitive resin compositions including those described in above documents, the present inventors discovered that such conventional photosensitive resin compositions cannot be considered to satisfy all of the required demands such as sufficiently high photosensitivity, satisfactorily minimal plating bath contamination and satisfactorily minimal sludge generation during the developing step, as well as adequately high resolution and adhesion when used in a photosensitive element.

Specifically, in the photosensitive resin compositions described in German Patent Specification No. 2027467, European Patent Application No. 11786, European Patent Application No. 220, European Patent Application No. 589 and Japanese Patent Application Laid-Open No. 6-69631, for example, the effect of the selected photopolymerization initiator improves the photosensitivity but prevents satisfactory minimization of plating bath contamination, and therefore all of the demands mentioned above cannot be satisfied.

The photosensitive resin composition described in U.S. Pat. No. 3,479,185 allows plating bath contamination to be prevented to some degree, but it has been found that the combination of the 2,4,5-triphenylimidazole dimer and hydrogen donor compound does not provide a good balance between resolution and adhesion for photosensitive element use. That is, when a relatively large amount of 2,4,5-triphenylimidazole dimer is used, the resist line width is increased and resolution is reduced, while a relatively larger proportion of the hydrogen donor compound lowers adhesion with the copper board, and therefore it is clearly impossible to satisfy all of the demands mentioned above. Moreover, when the photosensitive resin composition contains a relatively large amount of added photopolymerization initiator, which has inferior solubility in organic solvents such as 2,4,5-triphenylimidazole dimer, sludge tends to be generated in the developing solution during the developing step.

It was also found that a photosensitive resin composition such as described in U.S. Pat. No. 3,647,467 fails to provide the photosensitive element with sufficient resolution and adhesion, and therefore cannot satisfy all of the aforementioned demands.

A photosensitive resin composition such as disclosed in Japanese Patent Application Laid-Open No. 62-180355 has also been shown to have relatively high adhesion for copper substrates when used in a photosensitive element, but its photosensitivity is not high enough and the aforementioned demands therefore cannot all be satisfied.

It is therefore an object of the present invention, which has been accomplished in light of the circumstances described above, to provide a photosensitive resin composition with sufficiently high photosensitivity, satisfactorily minimal plating bath contamination, and satisfactorily minimal generation of sludge during the developing step, as well as sufficiently high resolution and adhesion when used in a photosensitive element.

SUMMARY OF THE INVENTION

In order to solve the problems referred to above, the photosensitive resin composition of the invention is characterized by comprising (A) a binder polymer, (B) a photopolymerizing compound with an ethylenic unsaturated bond, (C) a photopolymerization initiator and (D) a compound represented by the following general formula (1) or (2).

[Chemical Formula 1]

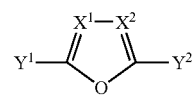

(1)

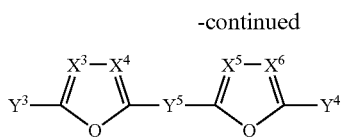

In these formulas, $X^1$, $X^2$, $X^3$, $X^4$, $X^5$ and $X^6$ (hereinafter also referred to as "$X^1$-$X^6$") each independently represent a CH group, CCH$_3$ group, CC$_2$H$_5$ group or nitrogen, $Y^1$, $Y^2$, $Y^3$ and $Y^4$ (hereinafter also referred to as "$Y^1$-$Y^4$") each independently represent optionally substituted aryl, and $Y^5$ represents optionally substituted arylene.

The photosensitive resin composition of the invention preferably comprises a 2,4,5-triarylimidazole dimer as component (C). Including such a compound as component (C) will allow the photosensitive resin composition of the invention to yield a photosensitive element with even higher adhesion and photosensitivity.

The photosensitive resin composition of the invention also preferably comprises a bisphenol A-type (meth)acrylate compound as component (B). This can further improve the adhesion with boards when the photosensitive resin composition is used as a photosensitive element.

Component (A) in the photosensitive resin composition of the invention preferably has an acid value of 30-200 mgKOH/g and a weight-average molecular weight of 20,000-300,000, from the standpoint efficient development and of achieving even higher developing solution resistance for the photocured photosensitive resin composition.

The photosensitive resin composition of the invention preferably has a component (A) content of 20-90 parts by weight, a component (B) content of 10-80 parts by weight, a component (C) content of 0.01-20 parts by weight and a component (D) content of 0.001-20 parts by weight, with respect to 100 parts by weight as the total of component (A) and component (B). By adjusting the content of each component in this way, a more satisfactory photosensitive resin composition of the invention can be obtained, having properties such as photosensitivity (photocuring properties), coatability, and adhesion and resolution when used in a photosensitive element.

A photosensitive element according to the invention is characterized by comprising a support and a photosensitive resin composition layer made of the aforementioned photosensitive resin composition formed on the support. Such a photosensitive element exhibits sufficiently excellent photosensitivity, plating bath contamination, resolution and adhesion.

The resist pattern forming method of the invention is characterized by laminating a photosensitive resin composition layer for the aforementioned photosensitive element on a circuit forming board, irradiating prescribed sections of the photosensitive resin composition layer with active light rays for photocuring of the exposed sections, and then removing the non-exposed sections.

The process for manufacturing a printed circuit board according to the invention is characterized by etching or plating a circuit forming board having a resist pattern formed thereon by the aforementioned resist pattern forming method.

DETAILED DESCRIPTION OF THE INVENTION

Figure 1:
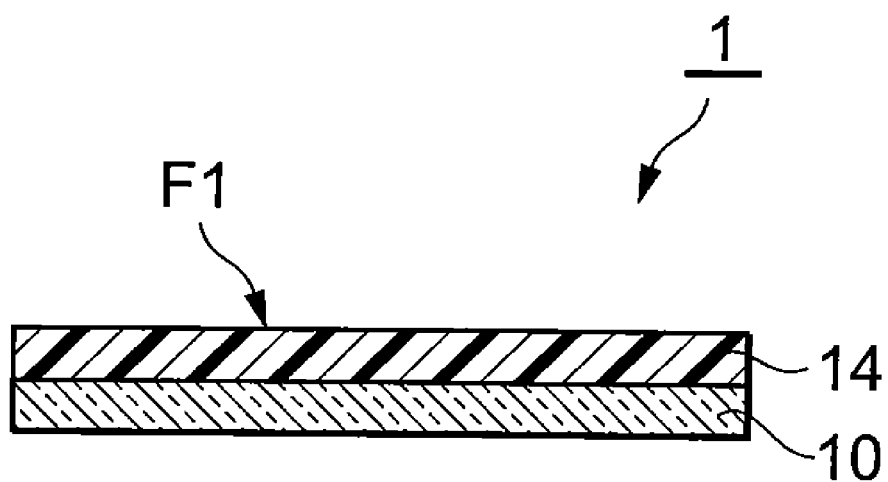
FIG. 1 is a schematic cross-sectional view showing a preferred embodiment of a photosensitive element of the invention.

Preferred embodiments of the invention will now be described in detail, with reference to the accompanying drawings as necessary. Throughout the present specification, "(meth)acrylic acid" refers to an acrylic acid compound or its corresponding methacrylic acid compound, "(meth)acrylate" refers to an acrylate or its corresponding methacrylate, "(meth)acryloyl group" refers to an acryloyl group or its corresponding methacryloyl group, and "(meth)acryloxy group" refers to an acryloxy group or its corresponding methacryloxy group.

The photosensitive resin composition of the invention comprises (A) a binder polymer (hereinafter referred to as "component A"), (B) a photopolymerizing compound with an ethylenic unsaturated bond (hereinafter referred to as "component B"), (C) a photopolymerization initiator (hereinafter referred to as "component C") and (D) a compound represented by general formula (1) or (2) above (hereinafter referred to as "component D").

(Component A)

The binder polymer as component A is not particularly restricted so long as it is conventionally used in photosensitive resin compositions, and for example, there may be mentioned acrylic-based resins, styrene-based resins, epoxy-based resins, amide-based resins, amidoepoxy-based resins, alkyd-based resins, phenol-based resins and the like. Acrylic-based resins are preferred among these from the viewpoint of alkali developing properties. These binder polymers may be used alone or in combinations of two or more.

Such binder polymers may be produced, for example, by radical polymerization of polymerizable monomers. As examples of polymerizable monomers there may be mentioned styrene derivatives such as styrene, vinyltoluene, α-methylstyrene, p-methylstyrene, p-ethylstyrene, p-methoxystyrene, p-ethoxystyrene, p-chlorostyrene or p-bromostyrene, acrylamides such as diacetoneacrylamide, acrylonitrile, vinyl alcohol esters such as vinyl-n-butyl ether, (meth)acrylic acid alkyl esters, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl (meth)acrylate, 2,2,3,3-tetrafluoropropyl (meth)acrylate, (meth)acrylic acid, α-bromo (meth)acrylic acid, α-chlor(meth)acrylic acid, β-furyl (meth)acrylic acid, β-styryl (meth)acrylic acid, maleic acid, maleic anhydride, maleic acid monoesters such as monomethyl maleate, monoethyl maleate and monoisopropyl maleate, fumaric acid, cinnamic acid, α-cyanocinnamic acid, itaconic acid, crotonic acid and propiolic acid.

More specifically, as the aforementioned (meth)acrylic acid alkyl esters there may be mentioned methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate and 2-ethylhexyl (meth)acrylate, as well as their structural isomers. These may be used alone or in combinations of two or more.

The binder polymer as component A preferably contains a carboxyl group, from the standpoint of achieving satisfactory alkali developing properties. A binder polymer with a carboxyl group may be produced, for example, by radical polymerization of a polymerizable monomer with a carboxyl group and another polymerizable monomer. Methacrylic acid is preferred as a carboxyl group-containing polymerizable monomer. When solvent development is carried out as the developing step, a small amount of the carboxyl group-containing polymerizable monomer is preferred.

The binder polymer as component A is preferably composed of styrene or a styrene derivative as the polymerizable monomer, from the standpoint of further improving the flexibility after photocuring. When styrene or a styrene derivative is used as a copolymerizing component, the styrene or styrene derivative content is preferably 0.1-30 wt %, more preferably 1-28 wt % and most preferably 1.5-27 wt % in order to achieve satisfactory adhesion and release properties. A content of less than 0.1 wt % will tend to result in inferior adhesion, while a content of greater than 30 wt % will tend to increase the sizes of released strips and lengthen the release time.

The binder polymer may also optionally have a photosensitive group.

The acid value of the binder polymer as component A is preferably 30-200 mgKOH/g and more preferably 45-150 mgKOH/g. An acid value of less than 30 mgKOH/g will tend to lengthen the developing time, while an acid value of greater than 200 mgKOH/g will tend to lower the developing solution resistance of the photocured resist.

The weight-average molecular weight (measured by gel permeation chromatography (GPC), with calculation based on a calibration curve using standard polystyrene) of the binder polymer as component A is preferably 20,000-300,000 and more preferably 25,000-150,000. A weight-average molecular weight of less than 20,000 will tend to lower the developing solution resistance, while a weight-average molecular weight of greater than 300,000 will tend to lengthen the developing time.

The binder polymer as component A may be of a single type or a combination of two or more types. As examples of binder polymers wherein a combination of two or more types are employed there may be mentioned two or more different binder polymers composed of different copolymerizing components, two or more different binder polymers with different weight-average molecular weights, and two or more different binder polymers with different dispersibilities. There may also be used a polymer having a multimode molecular weight distribution as described in Japanese Patent Application Laid-Open No. 11-327137.

The content of component A in the photosensitive resin composition is preferably 20-90 parts by weight, more preferably 30-85 parts by weight and most preferably 40-80 parts by weight with respect to 100 parts by weight as the total of component (A) and component (B). A content of less than 20 parts by weight will tend to promote fragility of the photocured composition and yield inferior coatability when used as a photosensitive element, while a content of greater than 90 parts by weight will tend to produce insufficient photosensitivity.

(Component B)

Component B is not particularly restricted so long as it is a photopolymerizing compound with at least one polymerizable ethylenic unsaturated group in the molecule (hereinafter referred to as "photopolymerizing compound"). As such photopolymerizing compounds there may be mentioned compounds obtained by reacting an α,β-unsaturated carboxylic acid with a polyhydric alcohol, bisphenol A-type (meth)acrylate compounds such as 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane and 2,2-bis(4-((meth)acryloxypolyethoxypolypropoxy)phenyl)propane, compounds obtained by reacting an α,β-unsaturated carboxylic acid with a glycidyl group-containing compound, urethane monomers such as urethane bond-containing (meth)acrylate compounds, nonylphenoxypolyethyleneoxy (meth)acrylate, phthalic acid-based compounds such as γ-chloro-β-hydroxypropyl-β'-(meth)acryloyloxyethyl-o-phthalate and β-hydroxyalkyl-β'-(meth)acryloyloxyalkyl-o-phthalate, and (meth)acrylic acid alkyl esters. From the viewpoint of adhesion with boards, preferably bisphenol A-type (meth)acrylate compounds and urethane bond-containing (meth)acrylate compounds, and more preferably bisphenol A-type (meth)acrylate compounds, are included as component B. These may be used alone or in combinations of two or more.

As specific compounds obtained by reacting an α,β-unsaturated carboxylic acid with a polyhydric alcohol there may be mentioned polyethyleneglycol di(meth)acrylates having 2-14 ethylene groups, polypropyleneglycol di(meth)acrylates having 2-14 propylene groups, polyethylene-polypropyleneglycol di(meth)acrylates having 2-14 ethylene groups and 2-14 propylene groups, trimethylolpropane di(meth)acrylate, trimethylolpropane tri(meth)acrylate, EO-modified trimethylolpropane tri(meth)acrylate, PO-modified trimethylolpropane tri(meth)acrylate, EO.PO-modified trimethylolpropane tri(meth)acrylate, tetramethylolmethane tri(meth)acrylate, tetramethylolmethane tetra(meth)acrylate, dipentaerythritol penta(meth)acrylate and dipentaerythritol hexa(meth)acrylate. These may be used alone or in combinations of two or more. Here, "EO" refers to ethylene oxide, and an EO-modified compound is one that has an ethylene oxide unit block structure. "PO" refers to propylene oxide, and a PO-modified compound is one that has a propylene oxide unit block structure.

As specific examples of the aforementioned 2,2-bis(4-((meth)acryloxypolyethoxy)phenyl)propane compounds there may be mentioned 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane. Among these, 2,2-bis(4-(methacryloxypentaethoxy)phenyl)propane is commercially available as BPE-500 (trade name of Shin-Nakamura Chemical Co., Ltd.), and 2,2-bis(4-(methacryloxypentadecaethoxy)phenyl)propane is commercially available as BPE-1300 (trade name of Shin-Nakamura Chemical Co., Ltd.). These compounds may be used alone or in combinations of two or more.

As specific examples of 2,2-bis(4-((meth)acryloxypolyethoxypolypropoxy)phenyl)propane compounds there may be mentioned 2,2-bis(4-((meth)acryloxydiethoxyoctapropoxy)phenyl)propane, 2,2-bis(4-((meth)acryloxytetraethoxytetrapropoxy)phenyl)propane and 2,2-bis(4-((meth)acryloxyhexaethoxyhexapropoxy)phenyl)propane. These may be used alone or in combinations of two or more.

As examples of the aforementioned urethane monomers there may be mentioned addition products of (meth)acrylic monomers having OH groups at the β position and diisocyanate compounds such as isophoronediisocyanate, 2,6-toluenediisocyanate, 2,4-toluenediisocyanate or 1,6-hexamethylenediisocyanate, etc.), tris((meth)

acryloxytetraethyleneglycol isocyanate)hexamethylene isocyanurate, EO-modified urethane di(meth)acrylate, and EO.PO-modified urethane di(meth)acrylate. As an example of an EO-modified urethane di(meth)acrylate there may be mentioned the commercially available product UA-11 (trade name of Shin-Nakamura Chemical Co., Ltd.). As an example of an EO.PO-modified urethane di(meth)acrylate there may be mentioned the commercially available product UA-13 (trade name of Shin-Nakamura Chemical Co., Ltd.).

As specific examples of the aforementioned nonylphenoxypolyethyleneoxy (meth)acrylates there may be mentioned nonylphenoxytetraethyleneoxy (meth)acrylate, nonylphenoxypentaethyleneoxy (meth)acrylate, nonylphenoxyhexaethyleneoxy (meth)acrylate, nonylphenoxyheptaethyleneoxy (meth)acrylate, nonylphenoxyoctaethyleneoxy (meth)acrylate, nonylphenoxynonaethyleneoxy (meth)acrylate, nonylphenoxydecaethyleneoxy (meth)acrylate and nonylphenoxyundecaethyleneoxy (meth)acrylate. These may be used alone or in combinations of two or more.

The content of component B is preferably 10-80 parts by weight, more preferably 15-70 parts by weight and most preferably 20-60 parts by weight with respect to 100 parts by weight as the total of component A and component B. A content of less than 10 parts by weight will tend to result in insufficient photosensitivity, while a content of greater than 80 parts by weight will tend to yield a fragile photocured composition.

(Component C)

The photopolymerization initiator used as component C is not particularly restricted so long as it produces active species such as radicals upon irradiation with light (active light rays, such as ultraviolet light or an electron beam) to allow polymerization of component A and component B.

As examples of component C there may be mentioned aromatic ketones including benzophenone, N,N'-tetraalkyl-4,4'-diaminobenzophenones such as N,N'-tetramethyl-4,4'-diaminobenzophenone (Michler's ketone), 2-benzyl-2-dimethylamino-1-(4-morpholinophenyl)-butanone-1,2-methyl-1-(4-(methylthio)phenyl)-2-morpholino-propanone-1 and the like, quinones such as alkylanthraquinones, benzoin compounds including benzoin ether compounds such as benzoin alkyl ethers, benzoin and alkylbenzoins, benzyl derivatives such as benzyldimethyl ketal, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, acridine derivatives such as 9-phenylacridine and 1,7-bis(9,9'-acridinyl)heptane, N-phenylglycine, N-phenylglycine derivatives, coumarin-based compounds, oxime-based compounds such as O-acyl-α-oxooximes, and the like. Any of the substituents on the six aryl groups of a 2,4,5-triarylimidazole dimer may be identical to yield a symmetrical compound, or they may be different to yield an asymmetrical compound. Preferred among these for component C from the standpoint of adhesion and photosensitivity are 2,4,5-triarylimidazole dimers, N,N'-tetraalkyl-4,4'-diaminobenzophenones and coumarin-based compounds. These photopolymerization initiators may be used alone or in combinations of two or more.

The content of component C is preferably 0.01-20 parts by weight, more preferably 0.02-15 parts by weight and most preferably 0.03-10 parts by weight with respect to 100 parts by weight as the total of component A and component B. A content of less than 0.01 part by weight will tend to result in insufficient photosensitivity, while a content of greater than 20 parts by weight will tend to increase the photoabsorption on the surface of the photosensitive resin composition during exposure, thereby producing inadequate photocuring in the interior.

(Component D)

Component D according to this embodiment is a compound represented by general formula (1) or (2) above. By using such a component D together with component A, component B and component C, the photosensitive resin composition of this embodiment exhibits sufficiently low plating bath contamination, and improved photosensitivity without reduced resolution and adhesion of the photosensitive resin composition.

From this viewpoint, the aryl groups represented by $Y^1$-$Y^4$ in formula (1) or (2) are each independently preferably a group represented by general formula (3) or (4) below, and the arylene group represented by $Y^5$ is preferably a group represented by general formula (5) or (6) below.

[Chemical Formula 2]

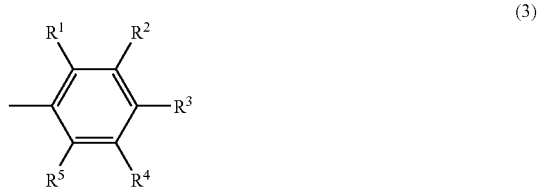

(3)

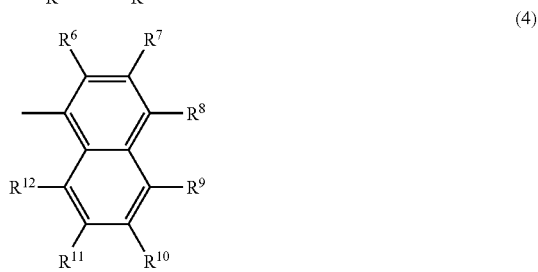

(4)

(5)

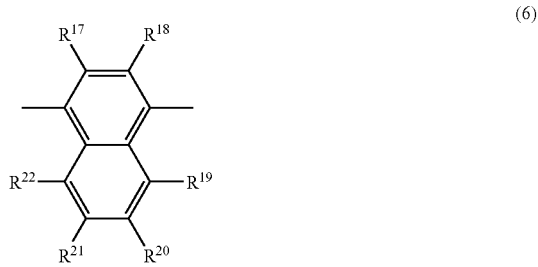

(6)

In these formulas, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$, $R^{21}$ and $R^{22}$ (hereinafter referred to as "$R^1$-$R^{22}$") each independently represent hydrogen, a halogen, C1-20 alkyl, C5-8 cycloalkyl, phenyl, benzyl, benzoyl, C2-12 alkoxycarbonyl, phenoxycarbonyl, cyano, nitro, C1-4 haloalkyl or any group represented by the following general formulas (7) to (14).

$$—OR^{23} \tag{7}$$

In formula (7), $R^{23}$ represents hydrogen, unsubstituted C1-12 alkyl, substituted C2-6 alkyl (where the substituent is one or more from among hydroxyl, mercapto, cyano, C1-4 alkoxyl, C3-6 alkenyloxy, 2-cyanoethoxy, C4-7 2-(alkoxycarbonyl)ethoxy, C2-5 alkylcarbonyloxy, phenylcarbonyloxy, carboxyl and C2-5 alkoxycarbonyl), C2-6 alkylethers having at least one oxygen between carbons in the main chain, C2-8 alkanoyl, —$(CH_2CH_2O)_nH$ (where n is an integer of 1-20), C3-12 alkenyl, C3-6 alkenoyl, cyclohexyl, phenyl (optionally substituted with a halogen, C1-12 alkyl or C1-4 alkoxyl), C7-9 phenylalkyl or —$Si(R^{28})_r(R^{29})_{3-r}$ (where $R^{28}$ represents C1-8 alkyl, $R^{29}$ represents phenyl and r represents an integer of 1-3).

   (8)

   (9)

   (10)

In formulas (8), (9) and (10), $R^{24}$ represents hydrogen, C1-12 alkyl, C3-12 alkenyl, cyclohexyl, substituted C2-6 alkyl (where the substituent is one or more from among hydroxyl, mercapto, cyano, C1-4 alkoxyl, C3-6 alkenyloxy, 2-cyanoethoxy, C4-7 2-(alkoxycarbonyl)ethoxy, C2-5 alkylcarbonyloxy, phenylcarbonyloxy, carboxyl and C2-5 alkoxycarbonyl), C2-12 alkylethers having at least one oxygen between carbons in the main chain, C2-12 alkylsulfides having at least one sulfur atom between carbons in the main chain, phenyl (optionally substituted with a halogen, C1-12 alkyl or C1-4 alkoxyl) or C7-9 phenylalkyl.

   (11)

   (12)

In formulas (11) and (12), $R^{25}$ and $R^{26}$ each independently represent hydrogen, C1-12 alkyl, C2-4 hydroxyalkyl, C2-10 alkoxyalkyl, C3-5 alkenyl, C5-12 cycloalkyl, C7-9 phenylalkyl, phenyl (optionally substituted with at least one from among C1-12 alkyl and C1-4 alkoxyl), C2-3 alkanoyl, C3-6 alkenoyl or benzoyl.

   (13)

   (14)

In formulas (13) and (14), $R^{27}$ represents C2-6 alkylidene (or a hydrocarbylidene group) (optionally having at least one oxygen atom or —$NR^{23}$— group between carbons in the main chain, and optionally substituted with one or more from among hydroxyl, C1-4 alkoxyl, C2-4 alkanoyloxy and benzoyloxy).

Of the C1-20 alkyl groups represented by $R^1$-$R^{22}$ above, C2-20 alkyl groups may have at least one oxygen atom between carbons in the main chain and may optionally have one or more hydroxyl substituents.

The phenyl, benzoyl and phenoxycarbonyl groups represented by $R^1$-$R^{22}$ may have one or more substituents from among C1-6 alkyl, phenyl, halogens and groups represented by general formulas (7) to (14) above.

Of the C2-12 alkoxycarbonyl groups represented by $R^1$-$R^{22}$ above, alkoxyl groups having 2-11 carbon atoms may have at least one oxygen atom between carbons in the main chain and may optionally have one or more hydroxyl substituents.

When $R^{23}$ in general formula (7), $R^{24}$ in general formulas (8) to (10) and $R^{25}$ and $R^{26}$ in general formulas (11) and (12) are benzene rings, the carbon atoms of the benzene ring and/or the carbon atoms bonded to the benzene ring may also form a portion of a 5-membered or 6-membered ring.

In a compound represented by general formula (1) or (2), preferably $R^1$-$R^{22}$ is each independently hydrogen, C1-4 alkyl, phenyl or benzyl, and more preferably, all of $R^1$, $R^2$, $R^3$, $R^4$ and $R^5$ (hereinafter referred to as "$R^1$-$R^5$") are hydrogen or one or two from among $R^1$-$R^5$ are C1-4 alkyl, phenyl or benzyl while the others are hydrogen, all of $R^6$, $R^7$, $R^8$, $R^9$, $R^{10}$, $R^{11}$ and $R^{12}$ (hereinafter referred to as "$R^6$-$R^{12}$") are hydrogen, or one or two from among $R^6$-$R^{12}$ are C1-4 alkyl, phenyl or benzyl while the others are hydrogen. Also preferably, all of $R^{13}$, $R^{14}$, $R^{15}$ and $R^{16}$ are hydrogen or all of $R^{17}$, $R^{18}$, $R^{19}$, $R^{20}$, $R^{21}$ and $R^{22}$ are hydrogen. By using such a compound as component D, the photosensitive resin composition of this embodiment can exhibit an even greater effect of inhibiting plating bath contamination, while providing further reduced resolution and adhesion, and further improved photosensitivity.

As specific preferred examples of compounds represented by general formula (1) or (2) there may be mentioned 2,5-diphenylfuran, 2,5-diphenyl-3,4-dimethylfuran, 2,5-diphenyl-3-ethylfuran, 2,5-di(p-methylphenyl)furan, 2,5-di(2,4-dimethylphenyl)furan, 2,5-di(p-butylphenyl)furan, 2,5-di(p-benzylphenyl)furan, 2-phenyl-5-(p-biphenylyl)furan, 2,5-di(p-biphenylyl)furan, 2-phenyl-5-α-naphthyl)furan, 2,5-diphenyloxazole, 2,5-diphenyl-3-methyloxazole, 2,5-di(p-isopropylphenyl)oxazole, 1,4-bis(2-(5-phenyloxazolyl))benzene, 1,4-bis(2-(4-methyl-5-phenyloxazolyl))benzene, 2-phenyl-5-(p-biphenylyl)oxazole, 2-phenyl-5-(α-naphthyl)oxazole, 2,5-di(α-naphthyl)oxazole, 1,4-bis(2-(5-phenyloxazolyl))naphthalene, 2,5-di(α-naphthyl)-1,3,4-oxadiazole, 2-phenyl-5-(α-naphthyl)-1,3,4-oxadiazole, 2,5-di(p-t-butylphenyl)-1,3,4-oxadiazole, 2,5-di(4-methyl-1-naphthyl)-1,3,4-oxadiazole, 2-phenyl-5-(p-biphenylyl)-1,3,4-oxadiazole, 2-(4-biphenylyl)-5-(4-t-butylphenyl)-1,3,4-oxadiazole and 1,4-bis(2-(5-phenyl-1,3,4-oxadiazolyl))benzene.

A compound represented by general formula (1) or (2) may be used alone, or two or more thereof may be used in combination.

The content of component D is preferably 0.001-20 parts by weight, more preferably 0.005-10 parts by weight and most preferably 0.01-5 parts by weight with respect to 100 parts by weight as the total of component A and component B. A content of less than 0.001 part by weight will tend to prevent sufficient photosensitivity, while a content of greater than 20 parts by weight will tend to prevent satisfactory adhesion or resolution.

The photosensitive resin composition of this embodiment comprises the aforementioned components A to D as essential components, but if necessary it may also contain a photopolymerizable compound with at least one cationic polymerizable cyclic ether group in the molecule (an oxetane compound, etc.), a cationic polymerization initiator, a dye such as malachite green, a photo color developer such as tribromomethylphenylsulfone or leucocrystal violet, a thermal coloring prevention agent, a plasticizer such as p-toluenesulfonamide, a pigment, a filler, a defoaming agent, a flame retardant, a stabilizer, a tackifier, a leveling agent, a release accelerator, an antioxidant, an fragrance, an imaging agent, a thermal crosslinking agent, or the like. Such additives may be used alone or in combinations of two or more. The contents of these additives are preferably about 0.01-20 parts by weight each with respect to 100 parts by weight as the total of component A and component B.

A photosensitive element according to the invention will now be explained.

FIG. 1 is a schematic cross-sectional view showing a preferred embodiment of a photosensitive element of the invention. The photosensitive element shown in FIG. 1 has a construction with a photosensitive resin composition layer 14 laminated on a support film 10. The photosensitive resin composition layer 14 is a layer composed of a photosensitive resin composition of the invention as described above.

The support 10 may be a metal plate made of copper, copper-based alloy, iron, iron-based alloy or the like, or a polymer film made of polyethylene terephthalate, polypropylene, polyethylene, polyester or the like. The thickness of the support is preferably 1-100 μm.

The photosensitive resin composition layer 14 may be formed by coating the aforementioned photosensitive resin composition of the invention as a liquid resist onto the support 10.

For coating of the photosensitive resin composition onto the support 10, the photosensitive resin composition may, if necessary, be dissolved in a prescribed solvent to a solid portion of 30-60 wt % for use as a coating solution. As examples of appropriate solvents there may be mentioned organic solvents such as methanol, ethanol, acetone, methyl ethyl ketone, methylcellosolve, ethylcellosolve, toluene, N,N-dimethylformamide and propyleneglycol monomethylether, as well as mixtures of these solvents.

The coating method may be, for example, a process using a roll coater, comma coater, gravure coater, air knife coater, die coater, bar coater or the like. The solvent may be removed by heating, for example, in which case the heating temperature is preferably about 70-150° C. and the heating time is preferably about 5-30 minutes.

The amount of residual organic solvent in the photosensitive resin composition layer 14 formed in this manner is preferably no greater than 2 wt % from the standpoint of preventing dispersion of the organic solvent in later steps.

The thickness of the photosensitive resin composition layer 14 will differ depending on the use, but the thickness after removal of the solvent is preferably about 1-100 μm.

If necessary, the photosensitive element 1 may also be covered with a protective film (not shown) on side F1 opposite the support side of the photosensitive resin composition layer 14.

The protective film may be a polymer film made of polyethylene, polypropylene or the like. The protective film also preferably has minimal fish-eyes, and the adhesive force between the protective film and the photosensitive resin composition layer 14 is preferably lower than the adhesive force between the photosensitive resin composition layer 14 and the support 10 in order to facilitate release of the protective film from the photosensitive resin composition layer 14.

The photosensitive element 1 may also comprise an interlayer or protective layer such as a cushion layer, adhesive layer, photoabsorbing layer or gas barrier layer, between the support 10 and the photosensitive resin composition layer 14 and/or between the photosensitive resin composition layer 14 and the protective film.

The photosensitive element 1 may be stored, for example, directly in a flat form or with a protective film further laminated on the other side of the photosensitive resin composition layer (the unprotected exposed side) prior to coiling up onto a cylindrical core into a roll form. The core is not particularly restricted so long as it is one used in the prior art, and there may be mentioned plastics such as, for example, polyethylene resin, polypropylene resin, polystyrene resin, polyvinyl chloride resin, ABS resin (acrylonitrile-butadiene-styrene copolymer) or the like. For storage, it is preferably coiled with the support on the outermost side. The edges of the photosensitive element coiled into a roll (photosensitive element roll) are preferably provided with an edge separator from the standpoint of edge protection, and a moisture-resistant edge separator from the standpoint of preventing edge fusion. Packing of the photosensitive element 1 is preferably accomplished by wrapping with a low-moisture-permeable black sheet.

A resist pattern forming method according to this embodiment of the invention will now be explained.

The resist pattern forming method of the invention is a method of laminating a photosensitive element according to the embodiment described above onto a circuit forming board so as to adhere the photosensitive resin composition layer thereto, irradiating it with active light rays in an image pattern for photocuring of the exposed sections, and then removing the non-exposed sections by development. A "circuit forming board" is a board provided with an insulating layer and a conductive layer formed on the insulating layer.

When the photosensitive element is provided with a protective film, the method of laminating the photosensitive resin composition layer on the circuit forming board may be a method in which the protective film is first removed, and then the photosensitive resin composition layer is contact bonded onto the circuit forming board at a pressure of about 0.1-1 MPa (about 1-10 kgf/cm$^2$) while heating at about 70-130° C. Alternatively, the lamination step may be carried out under reduced pressure. The surface of the circuit forming board on which the photosensitive resin composition layer is laminated will usually be a metal surface, but is not particularly restricted.

The photosensitive resin composition layer which has been laminated on a board in the manner described above is irradiated with active light rays into an image through a negative or positive mask pattern, to form exposed sections. When the support on the photosensitive resin composition layer is transparent to the active light rays, the active light rays may be irradiated through the support, but when the support is opaque to the active light rays, it must be removed before irradiating the photosensitive resin composition layer with the active light rays.

The light source for the active light rays may be a publicly known light source which efficiently emits ultraviolet rays or visible light rays, such as a carbon arc lamp, mercury-vapor arc lamp, high-pressure mercury lamp or xenon lamp. There may also be employed a laser direct writing exposure method.

After formation of the exposed sections, removal of the sections of the photosensitive resin composition layer other than the exposed sections (that is, the non-exposed sections) by development forms a resist pattern. When the support is present on the photosensitive resin composition layer, the method of removing the non-exposed sections may be a method in which the support is first removed with an autopeeler or the like, and the unexposed sections are removed by wet development with an aqueous alkali solution, aqueous developing solution or organic solvent, or by dry development. An aqueous alkali solution for wet development may be, for example, a 0.1-5 wt % sodium carbonate dilute solution, a 0.1-5 wt % potassium carbonate dilute solution or a 0.1-5 wt % sodium hydroxide dilute solution. The pH of the aqueous alkali solution is preferably in the range of 9-11, and the temperature is adjusted for the developing properties of the photosensitive resin composition. The aqueous alkali solution may also contain a surfactant, defoaming agent, organic solvent or the like. As examples of developing systems there may be mentioned dip systems, spray systems, brushing systems and slapping systems.

For post-development treatment, when necessary, the resist pattern may be further cured by heating at about 60-250° C. or exposure at about 0.2-10 J/cm$^2$.

A printed circuit board manufacturing process for this embodiment will now be explained.

The printed circuit board manufacturing process for this embodiment involves etching or plating a circuit forming board having a resist pattern formed thereon by the aforementioned embodiment of a resist pattern forming method.

The etching or plating of the circuit forming board is carried out on the conductive layer of the circuit forming board, with a formed resist pattern as the mask. As etching solutions there may be mentioned copper(II) chloride solution, iron(II) chloride solution and alkali etching solutions, among which iron(II) chloride solution is preferably used from the standpoint of achieving a satisfactory etch factor. When plating is carried out, the type of plating may be copper plating such as copper sulfate plating or copper pyrophosphate plating, solder plating such as high-slow solder plating, nickel plating such as Watt bath (nickel sulfate-nickel chloride) plating or nickel sulfamate plating, or gold plating such as hard gold plating or soft gold plating.

After completion of the etching or plating, the resist pattern may be released with a stronger aqueous alkali solution than the aqueous alkali solution used for development. Examples of such stronger aqueous alkali solutions include a 1-10 wt % aqueous sodium hydroxide solution and a 1-10 wt % aqueous potassium hydroxide solution. The releasing method may be, for example, a dipping system or spraying system.

A printed circuit board is obtained in this manner, and a printed circuit board with adequately high density can be manufactured by using a photosensitive element of this embodiment which has sufficiently high resolution, photosensitivity and adhesion and satisfactorily low plating bath contamination in the printed circuit board manufacturing process of this embodiment. The printed circuit board of this embodiment may be a multilayer printed circuit board, and may optionally have miniature through-holes.

Preferred embodiments of the invention have been explained above, but the invention is not limited only to those described.

EXAMPLES

The present inventions will now be explained in greater detail through examples, with the understanding that these examples are in no way limitative on the invention.

[Synthesis of Binder Polymer A1]

After adding 700 g of a mixed solution of methylcellosolve and toluene (methylcellosolve/toluene=3/2 (by weight), hereinafter referred to as "solution A") to a flask equipped with a stirrer, reflux condenser, thermometer, dropping funnel and nitrogen gas inlet tube, it was stirred while blowing in nitrogen gas, and heated to 85° C. Separately, a mixed solution of 110 g of methacrylic acid, 225 g of methyl methacrylate, 135 g of ethyl acrylate, 30 g of styrene and 3 g of azobisisobutyronitrile (hereinafter referred to as "solution B") was prepared, and then solution B was added dropwise to the 85° C.-heated solution A over a period of 4 hours and the mixture was kept for 2 hours while stirring at 85° C. Next, a solution of 0.3 g of azobisisobutyronitrile in 60 g of solution A was added dropwise to the flask over a period of 10 minutes. After the dropwise addition, the solution was kept for 5 hours at 85° C. while stirring and cooled to obtain binder polymer A1. The non-volatile content of the binder polymer A1 was 48.8 wt %, and the weight-average molecular weight was 84,000. The weight-average molecular weight value was determined by gel permeation chromatography measurement and calculation with a calibration curve using standard polystyrene.

Examples 1-5, Comparative Examples 1, 2

First, solutions were obtained by mixing component (A), component (B) and other components in the proportions listed in Table 1. The weight of the binder polymer A1 in Table 1 is the non-volatile weight.

TABLE 1

| | | Content (parts by weight) |
|---|---|---|
| Component A | Binder polymer A1 | 60 |
| Component B | BPE-500*[1] | 28 |
| | NP-8EA*[2] | 6 |
| | MECHPP*[3] | 6 |
| Additive | Leucocrystal violet | 1 |
| | Malachite green | 0.03 |
| Solvent | Acetone | 10 |
| | Toluene | 7 |
| | N,N-dimethylformamide | 3 |

In Table 1, *[1] is 2,2-bis(4-(methacryloxypentaethoxy)phenyl)propane (trade name of Shin-Nakamura Chemical Co., Ltd.), *[2] is nonylphenoxyoctaethylene oxyacrylate (trade name of Kyoeisha Chemical Co., Ltd.), and *[3] is γ-chloro-β-hydroxypropyl-β'-methacryloyloxyethyl-o-phthalate (trade name of Osaka Organic Chemical Industry, Ltd.).

The following compounds as component (C) and component (D) were added to the obtained solutions in the contents (units: parts by weight) shown in Table 2 to obtain solutions of photosensitive resin compositions for Examples 1-5 and Comparative Examples 1 and 2.

TABLE 2

| | | Example 1 | Example 2 | Example 3 | Example 4 | Example 5 | Comp. Ex. 1 | Comp. Ex. 2 |
|---|---|---|---|---|---|---|---|---|
| Component C | CI-HABI | 1 | 1.5 | 2 | 1.5 | 1 | 3 | 2 |
| | EAB | 0.2 | 0.1 | 0.1 | — | 0.2 | 0.1 | 0.2 |
| | BP | — | — | — | — | — | — | 5 |
| Component D | DPF | 1 | — | — | — | — | — | — |
| | DPO | — | 2 | — | — | 0.5 | — | — |
| | Butyl-PBD | — | — | 1.5 | — | — | — | — |
| | POPOP | — | — | — | 0.2 | 0.1 | — | — |

In Table 2, "Cl-HABI" represents 2,2'-bis(o-chlorophenyl)-4,4',5,5'-tetraphenylimidazole dimer, "EAB" represents diethylaminobenzophenone (trade name of Hodogaya Chemical Co., Ltd.), "BP" represents benzophenone, "DPF" represents 2,5-diphenylfuran, "DPO" represents 2,5-diphenyloxazole (trade name of Dojindo Corp.), "Butyl-PBD" represents 2-(4-biphenylyl)-5-(4-t-butylphenyl)-1,3,4-oxadiazole (trade name of Dojindo Corp.), and "POPOP" represents 1,4-bis(2-(5-phenyloxazolyl))benzene (trade name of Dojindo Corp.).

[Fabrication of Photosensitive Elements]

The photosensitive resin compositions of Examples 1-5 and Comparative Examples 1 and 2 were each used to fabricate a photosensitive element according to the following procedure. First, a polyethylene terephthalate (hereinafter referred to as "PET") film strip with a width of 380 mm and a thickness of 20 μm was coated with a solution of each of the photosensitive resin compositions of Examples 1-5 and Comparative Examples 1 and 2, and then held in a hot air convection drier set to 100° C. to form a photosensitive resin composition layer. The thickness of the photosensitive resin composition layer after heating was 40 μm. Also, a 35 μm-thick polyethylene film was placed on the formed photosensitive resin composition layer and pressed with a roll, to obtain photosensitive elements of Examples 1-5 and Comparative Examples 1 and 2 having the photosensitive resin composition layer covered with a protective film.

[Fabrication of Samples for Property Evaluation]

The copper surface of a copper-clad board (trade name: MCL-E-67 by Hitachi Chemical Co., Ltd.), comprising a glass epoxy material laminated on both sides with a copper foil (35 μm thickness), was polished using a Scotch-Brite buff roll (trade name of Sumitomo-3M) and then rinsed with water and dried with an air stream. The copper-clad board obtained in this manner was heated to 60° C., and then the copper side thereof was laminated with the photosensitive resin composition layer of each of the photosensitive elements of Examples 1-5 and Comparative Examples 1 and 2 while heating to 100° C., to obtain samples for property evaluation of Examples 1-5 and Comparative Examples 1 and 2.

The samples for property evaluation of Examples 1-5 and Comparative Examples 1 and 2 obtained in the manner described above were used for evaluation of photosensitivity, adhesion and resolution. Each of the photosensitive elements of Examples 1-5 and Comparative Examples 1 and 2 was used for evaluation of plating bath contamination and sludge volume.

[Photosensitivity Evaluation]

First, a Stouffer 21-step tablet was situated as a negative on the sample for property evaluation, and the sample for property evaluation was exposed through the negative at an exposure dose of 60 mJ/cm$^2$, using an exposure device (HMW-590, trade name of Oak Manufacturing Co., Ltd.) with a high-pressure mercury lamp.

After exposure, the sample was allowed to stand at room temperature for 15 minutes, the PET was removed, and development was performed by spraying with a 1 wt % aqueous sodium carbonate solution (30° C.). The step number of the step tablet for the photocured film formed on the copper-clad board was determined to evaluate the photosensitivity of the photosensitive resin composition. The results are shown in Table 3. In Table 3, the photosensitivity is indicated by the step number of the step tablet, with a higher step number indicating higher photosensitivity.

TABLE 3

|  | Example 1 | Example 2 | Example 3 | Example 4 | Example 5 | Comp. Ex. 1 | Comp. Ex. 2 |
|---|---|---|---|---|---|---|---|
| Photosensitivity | 9 | 9 | 9 | 9 | 9 | 8 | 9 |
| Adhesion (μm) | 35 | 30 | 30 | 35 | 30 | 40 | 45 |
| Resolution (μm) | 40 | 40 | 40 | 40 | 40 | 45 | 45 |
| Plating bath contamination [Alloy ratio] | 0.97 | 0.98 | 0.97 | 0.99 | 0.98 | 0.97 | 0.7 |
| Sludge volume (g/L) | 0.5 | 0.7 | 0.9 | 0.7 | 0.5 | 1.8 | 1.5 |

[Adhesion Evaluation]

First, a phototool having a wiring pattern with a line/space width of 10/400-50/400 (units: μm) was placed on the sample for property evaluation, and the sample was exposed through the phototool at an exposure dose to the 8th step of a 21-step tablet using an exposure device (HMW-590, trade name of Oak Manufacturing Co., Ltd.) with a high-pressure mercury lamp.

After exposure, the sample was allowed to stand at room temperature for 15 minutes, the PET was removed, and development was performed by spraying with a 1 wt % aqueous sodium carbonate solution (30° C.). The minimum line width (μm) remaining without peeling after development was measured for evaluation of the adhesion. The results are shown in Table 3. In Table 3, the adhesion is indicated by the minimum line width, with a smaller minimum line width indicating more excellent adhesion.

[Resolution Evaluation]

First, a phototool having a wiring pattern with a line/space width of 10/10-50/50 (units: μm) was placed on the sample for property evaluation, and the sample was exposed through the phototool at an exposure dose to the 8th step of a 21-step tablet using an exposure device (HMW-590, trade name of Oak Manufacturing Co., Ltd.) with a high-pressure mercury lamp.

After exposure, the sample was allowed to stand at room temperature for 15 minutes, the PET was removed, and development was performed by spraying with a 1 wt % aqueous sodium carbonate solution (30° C.). The minimum line width (μm) remaining without peeling after development was measured for evaluation of the resolution. The results are shown in Table 3. In Table 3, the resolution is indicated by the minimum line width, with a smaller minimum line width indicating more excellent resolution.

[Plating Bath Contamination Evaluation]

First, the photosensitive element was exposed with an exposure dose to the 8th step of a 21-step tablet. After exposure, the PET and polyethylene films were removed to obtain an exposed and photocured photosensitive resin composition layer (cured film). Next, the cured film was dipped into a solder plating solution (comprising 64 mL/L of 45 wt % tin fluoroborate, 22 mL/L of 45 wt % lead fluoroborate, 200 mL/L of 42 wt % fluoroboric acid, 20 g/L of Pultin LA conductivity salt (trade name of Japan Meltex Inc.) and 40 mL/L of Pultin LA starter (trade name of Japan Meltex Inc.) at 0.1 m²/L. After allowing the cured film to stand immersed at room temperature for 7 days, the solder plating solution without the cured film was poured into a Hull cell plating apparatus for plating for 5 minutes at a current of 1A.

After plating, a fluorescent X-ray film thickness meter (SFT-158V, Seiko Instruments) was used to measure the tin/lead ratio (R1) of the plated film at a section with a current density of 2A/dm². The tin/lead ratio (R2) of a solution in which no cured film had been dipped was used as a blank, and R1/R2 was calculated as the alloy ratio. The results are shown in Table 3. In Table 3, the plating bath contamination is indicated by the value of the alloy ratio, with a value closer to 1 indicating lower plating bath contamination.

[Sludge Volume Evaluation]

The following procedure was carried out in order to evaluate the sludge volume generated in the developing step. First, 1 L of a 1 wt % aqueous sodium carbonate solution was prepared, and the photosensitive resin composition layer prior to exposure, obtained by release of the PET and polyethylene film from the aforementioned photosensitive element, was dissolved therein to a dissolved concentration of 0.6 mil·m²/L in the aqueous solution to obtain a resin composition solution. Here, "a dissolved concentration of 0.6 mil·m²/L" corresponds to a concentration upon dissolving a photosensitive resin composition layer with a film thickness of 25.4 μm and a main side area of 0.6 m² in 1 L of the aqueous solution. The resin composition solution was circulated for 90 minutes under conditions of 6 MPa (0.6 kgf/cm²), 30° C. using a miniature developing device (pump: "Iwaki magnet pump MD30RZ-N", trade name of Iwaki Co., nozzle: "GG-SQ3.6SQ", trade name of Spray Ink Systems Japan). Next, after waiting for the circulated resin composition solution to defoam in cases where foam was generated, the resin composition solution was sampled in a 10 mL test tube and centrifuged at 2000 rpm for 10 minutes using a centrifugal separator ("H-18", trade name of Kokusan Enshinki Co., Ltd.).

The sediment (sludge) obtained by removing off the supernatant of the centrifuged resin composition solution was dried at 120° C. for 2 hours using a drier ("HISPEC HG220", trade name of Kusumoto Kagaku Co., Ltd.) and weighed, and the weight of the sludge after drying per 1 L of resin composition solution was evaluated as the sludge volume. A smaller sludge volume indicates better inhibition of sludge generation.

INDUSTRIAL APPLICABILITY

According to the present invention, it is possible to provide a photosensitive resin composition with sufficiently high photosensitivity, satisfactorily minimal plating bath contamination and satisfactorily minimal sludge generation during the developing step, as well as adequately high resolution and adhesion when used in a photosensitive element According to the present invention it is possible to provide a photosensitive resin composition having sufficiently high photosensitivity, satisfactorily minimal plating bath contamination, and satisfactorily minimal generation of sludge during the developing step, as well as sufficiently high resolution and adhesion when used in a photosensitive element.

The invention claimed is:

1. A photosensitive resin composition comprising:
   (A) a binder polymer;
   (B) a photopolymerizing compound with an ethylenic unsaturated bond;
   (C) a photopolymerization initiator; and
   (D) a compound represented by the following general formula (1a), (1b), (1c), or (2),

(1a)

(1b)

(1c)

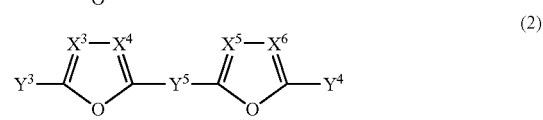
(2)

wherein in formula (1a), $X^1$ represents a CH group, a $CCH_3$ group, a $CC_2H_5$ group, or nitrogen, $X^2$ represents a CH group, a $CCH_3$ group, or a $CC_2H_5$ group, and $Y^1$ and $Y^2$ represent mutually different optionally substituted aryl;

in formula (1b), $X^1$ and $X^2$ both represent nitrogen, and $Y^1$ and $Y^2$ represent mutually different optionally substituted aryl;

in formula (1c), $X^1$ and $X^2$ both represent nitrogen and $Y^1$ and $Y^2$ both represent mutually the same group represented by formula (3) or formula (4)

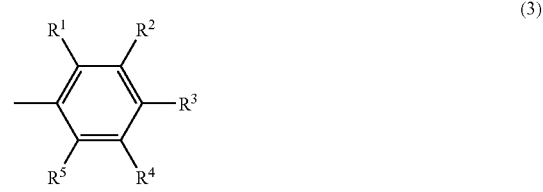
(3)

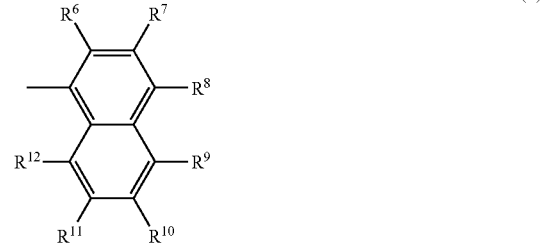
(4)

wherein in formulae (3) and (4), at least one of R1, R2, R3, R4, R5, R6, R7, R8, R9, R10, R11, R12 represents C1-20 alkyl and the other represent hydrogen; and in formula (2), $X^3$, $X^4$, $X^5$ and $X^6$ each independently represent a CH group, a $CCH_3$ group, a $CC_2H_5$ group or nitrogen, $Y^3$ and $Y^4$ each independently represent optionally substituted aryl, and $Y^5$ represents optionally substituted arylene, wherein the acid value of component (A) is 45-200 mg KOH/g, and wherein component (A) contains polymerizable monomer with a carboxyl group, (meth)acrylic acid alkyl esters, and styrene or a styrene derivative as a copolymerizing component, component (B) contains a bisphenol A-type (meth)acrylate compound, and component (C) contains a 2,4,5-triarylimidazole dimer, and wherein component (A) contains 0.1 to 30 wt % of the styrene or styrene derivative as a copolymerizing component, with respect to the total amount of component (A), and the photosensitive resin composition is developable in an aqueous alkali solution having a pH in the range of 9 to 11.

2. A photosensitive resin composition according to claim 1, wherein the weight-average molecular weight of component (A) is 20,000-300,000.

3. A photosensitive resin composition according to claim 1, wherein the component (A) content is 20-90 parts by weight, the component (B) content is 10-80 parts by weight, the component (C) content is 0.01-20 parts by weight and the component (D) content is 0.001-20 parts by weight, with respect to 100 parts by weight as the total of component (A) and component (B).

4. A photosensitive element comprising a support and a photosensitive resin composition layer composed of a photosensitive resin composition according to claim 1 formed on the support.

5. A resist pattern forming method comprising the steps of:
laminating a photosensitive resin composition layer for a photosensitive element according to claim 4 on a circuit forming board;
irradiating prescribed sections of the photosensitive resin composition layer with active light rays for photocuring of exposed sections; and then
removing non-exposed sections by development with aqueous alkali solution having a pH in the range of 9 to 11.

6. A process for manufacturing a printed circuit board comprising the steps of etching or plating a circuit forming board having a resist pattern formed thereon by a resist pattern forming method according to claim 5.

7. A photosensitive resin composition comprising:
(A) a binder polymer;
(B) a photopolymerizing compound with an ethylenic unsaturated bond;
(C) a photopolymerization initiator; and
(D) one or more compounds selected from the group consisting of 2,5-diphenylfuran, 2,5-diphenyl-3,4-dimethylfuran, 2,5-diphenyl-3-ethylfuran, 2,5di(p-methylphenyl)furan, 2,5 -di(2,4-dimethylphenyl)furan, 2,5-di(p-butylphenyl)furan, 2,5-di(p-benzylphenyl)furan, 2-phenyl-5-(p-biphenylyl)furan, 2,5 -di(p-biphenylyl)furan, 2-phenyl-5-($\alpha$-naphthyl)furan, 2,5-diphenyloxazole, 2,5-diphenyl-3-methyloxazole, 2,5-di(p-isopropylphenyl)oxazole, 1,4-bis(2-(5-phenyloxazolyl))benzene, 1,4-bis(2-(4-methyl-5-phenyloxazolyl))benzene, 2-phenyl-5-(p-biphenylyl)oxazole, 2-phenyl-5 -($\alpha$-naphthyl)oxazole, 2,5-di($\alpha$-naphthyl)oxazole, 1,4-bis(2-(5-phenyloxazolyl))naphthalene, 2,5-di($\alpha$-naphthyl)- 1,3,4-oxadiazole, 2-phenyl-5-($\alpha$naphthyl)-1,3,4-oxadiazole, 2,5-di(p-t-butylphenyl)-1,3,4-oxadiazole, 2,5-di(4-methyl- 1-naphthyl)-1,3,4-oxadiazole, 2-phenyl-5-(p-biphenylyl)- 1,3,4-oxadiazole, 2-(4-biphenylyl)-5-(4-t-butylphenyl)- 1,3,4-oxadiazole, and 1,4-bis(2-(5-phenyl-1,3,4-oxadiazolyl))benzene, wherein the acid value of component (A) is 45-200 mg KOH/g, and wherein component (A) contains polymerizable monomer with a carboxyl group, (meth)acrylic acid alkyl esters, and styrene or a styrene derivative as a copolymerizing component, component (B) contains a bisphenol A-type (meth)acrylate compound, and component (C) contains a 2,4,5-triarylimidazole dimer, and wherein component (A) contains 0.1 to 30 wt % of the styrene or styrene derivative as a copolymerizing component, with respect to the total amount of component (A), and the photosensitive resin composition is developable in an aqueous alkali solution having a pH in the range of 9 to 11.

8. A photosensitive resin composition according to claim 7, wherein the component (A) content is 20-90 parts by weight, the component (B) content is 10-80 parts by weight, the component (C) content is 0.0 1-20 parts by weight and the component (D) content is 0.001-20 parts by weight, with respect to 100 parts by weight as the total of component (A) and component (B).

9. A photosensitive resin composition according to claim 2, wherein the component (A) content is 20-90 parts by weight, the component (B) content is 10-80 parts by weight, the component (C) content is 0.01-20 parts by weight and the component (D) content is 0.00 1-20 parts by weight, with respect to 100 parts by weight as the total of component (A) and component (B).

10. A photosensitive element comprising a support and a photosensitive resin composition layer composed of a photosensitive resin composition according to claim 7 formed on the support.

11. A photosensitive element comprising a support and a photosensitive resin composition layer composed of a photosensitive resin composition according to claim 2 formed on the support.

12. A photosensitive element comprising a support and a photosensitive resin composition layer composed of a photosensitive resin composition according to claim 3 formed on the support.

13. A photosensitive resin composition according to claim 7, wherein the weight-average molecular weight of component (A) is 20,000-300,000.

14. A photosensitive resin composition according to claim 1, wherein the component (C) contains 1.0 to 2.0 parts by weight of 2,4,5-triarylimidazole dimer, with respect to 100 parts by weight as the total of component (A) and component (B).

15. A resist pattern forming method that comprises the steps of:
laminating a photosensitive resin composition layer for a photosensitive element according to claim 4 on a circuit forming board;
irradiating prescribed sections of the photosensitive resin composition layer with active light rays for photocuring of exposed sections; and
removing non-exposed sections by developing with an aqueous alkali solution having a pH in the range of 9 to 11, wherein the aqueous alkali solution is selected from the group consisting of 0.1 to 5.0 wt % of sodium carbonate dilute solution 0.1 to 5.0 % wt % of potassium carbonate dilute solution, and 0.1 to 5.0 % wt % of sodium hydroxide dilute solution.

16. A process for manufacturing a printed circuit board that comprises the step of:
etching or plating a circuit forming board having a resist pattern formed thereon by a resist pattern forming method according to claim 15.

* * * * *